(12) United States Patent
Wang et al.

(10) Patent No.: US 12,402,252 B2
(45) Date of Patent: Aug. 26, 2025

(54) CIRCUIT BOARD MODULE

(71) Applicant: Chicony Electronics Co., Ltd., New Taipei (TW)

(72) Inventors: Hsueh Hua Wang, New Taipei (TW); Peng Yi Hsieh, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 262 days.

(21) Appl. No.: 18/170,499

(22) Filed: Feb. 16, 2023

(65) Prior Publication Data

US 2024/0023245 A1 Jan. 18, 2024

(30) Foreign Application Priority Data

Jul. 14, 2022 (TW) ................................. 111126510

(51) Int. Cl.
*H05K 1/14* (2006.01)
*H04N 23/57* (2023.01)
*H05K 1/18* (2006.01)

(52) U.S. Cl.
CPC ............. *H05K 1/144* (2013.01); *H04N 23/57* (2023.01); *H05K 1/183* (2013.01); *H05K 2201/041* (2013.01); *H05K 2201/09027* (2013.01)

(58) Field of Classification Search
CPC ............ H05K 1/14; H05K 1/18; H05K 1/144; H05K 1/183; H05K 2201/041; H04N 23/57

USPC .......................................................... 361/760
See application file for complete search history.

(56) References Cited

FOREIGN PATENT DOCUMENTS

CN          213660826       7/2021
TW          M597983         7/2020

OTHER PUBLICATIONS

Translation of Wang et al., TWM597983 (Jul. 1, 2020) (Year: 2020).*
"Office Action of Taiwan Counterpart Application", issued on Nov. 21, 2023, p. 1-p. 7.

* cited by examiner

*Primary Examiner* — Tremesha W Burns
(74) *Attorney, Agent, or Firm* — JCIPRNET

(57) ABSTRACT

A circuit board module, including a circuit board body, two camera elements, two board-to-board connectors, and an external circuit board, is provided. The circuit board body includes a surface and at least one groove recessed in the surface. The two camera elements are disposed in the at least one groove and electrically connected to the circuit board body. The two board-to-board connectors are disposed on the circuit board body. The external circuit board includes two connection ports pluggably connected to the two board-to-board connectors, so that the external circuit board is electrically connected to the circuit board body.

14 Claims, 6 Drawing Sheets

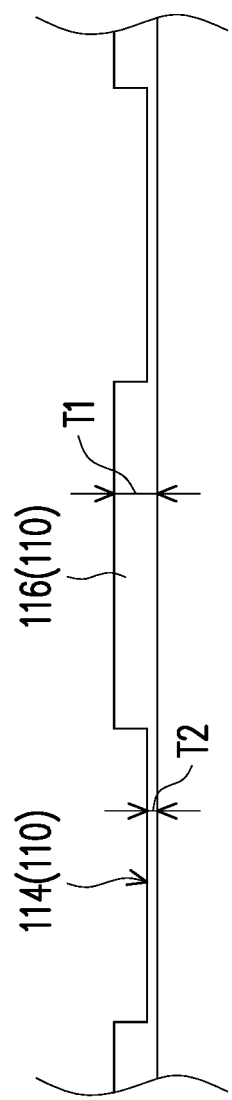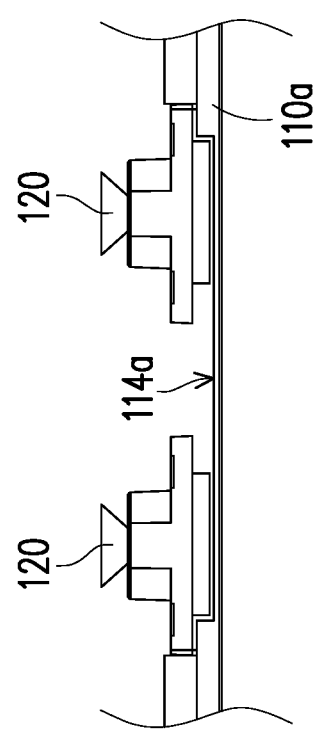

CIRCUIT BOARD MODULE

CROSS-REFERENCE TO RELATED APPLICATION

This application claims the priority benefit of Taiwan application serial no. 111126510, filed on Jul. 14, 2022. The entirety of the above-mentioned patent application is hereby incorporated by reference herein and made a part of this specification.

BACKGROUND

Technical Field

The disclosure relates to a circuit board module, and in particular, to a circuit board module applicable to a thin device.

Description of Related Art

In order to meet the application demand trend of today's users, electronic devices are becoming thinner and thinner. The goal of research in this field is, for example, how the circuit board module disposed by electronic elements, such as camera elements, should respond to this trend.

SUMMARY

The disclosure provides a circuit board module which can be applied to thin devices.

The circuit board module of the disclosure includes a circuit board body, two camera elements, two board-to-board connectors, and an external circuit board. The circuit board body includes a surface and at least one groove recessed in the surface. The two camera elements are disposed in the at least one groove and electrically connected to the circuit board body. The two board-to-board connectors are disposed on the circuit board body. The external circuit board includes two connection ports pluggably connected to the two board-to-board connectors, so that the external circuit board is electrically connected to the circuit board body.

In an embodiment of the disclosure, the at least one groove includes two grooves, and two camera elements are respectively disposed in the two grooves.

In an embodiment of the disclosure, the circuit board body includes a wiring section between the two grooves. The two camera elements are electrically connected to each other through the external circuit board, but not electrically connected to each other through the wiring section.

In an embodiment of the disclosure, the external circuit board includes a main section and two branches extending from the main section. The two connection ports are respectively disposed on the two branches and pluggably connected to the two board-to-board connectors.

In an embodiment of the disclosure, the circuit board module further includes at least one first electronic element disposed on the surface and electrically connected to the circuit board body. Each board-to-board connector is disposed on the surface, and the height of each board-to-board connector and the first electronic element is less than the height of each camera element.

In an embodiment of the disclosure, the circuit board module further includes at least one second electronic element disposed on the surface and electrically connected to the circuit board body. The height of each second electronic element is less than the height of each camera element.

In an embodiment of the disclosure, each of the first electronic elements includes a microphone, and each of the second electronic elements includes a light source.

In an embodiment of the disclosure, the at least one first electronic element includes two first electronic elements, and at least one second electronic element includes two second electronic elements. The two camera elements are adjacent to each other. The two first electronic elements are located on two sides of the two camera elements. The two second electronic elements are located on two sides of the two camera elements. The two board-to-board connectors are located on two sides of the two camera elements.

In an embodiment of the disclosure, the at least one groove is one groove, and the two camera elements are disposed in the groove.

In an embodiment of the disclosure, the external circuit board is provided with wiring and no electronic part is disposed on the external circuit board.

In an embodiment of the disclosure, the thickness of the circuit board body at each groove is less than half of the thickness of the circuit board body at positions other than the at least one groove.

In an embodiment of the disclosure, the thickness of the circuit board body at each groove is less than 0.2 mm, and the thickness of the circuit board body at positions other than the at least one groove is less than 0.5 mm.

In an embodiment of the disclosure, the width of the circuit board body is less than 3 mm.

In an embodiment of the disclosure, the width of the circuit board body is the same as the width of each camera element.

Based on the above, the circuit board body of the circuit board module of the disclosure includes a groove recessed in the surface. The electronic element is, for example, a camera element, disposed in the groove and electrically connected to the circuit board body to reduce the overall height. In addition, because the circuit board body is provided with grooves, the space for disposing wiring on the circuit board body is relatively reduced. In order to obtain more wiring space, the connection port of the external circuit board is pluggably connected to the board-to-board connector of the circuit board body, so that the external circuit board is electrically connected to the circuit board body. Therefore, the wiring originally to be disposed on the circuit board body is changed to the external circuit board. The external circuit board is used to make up for the space for disposing wiring on the circuit board body, thereby optimizing the wiring disposition.

BRIEF DESCRIPTION OF THE DRAWINGS

FIG. 4 is a schematic partial enlarged view of the circuit board body of FIG. 3.

FIG. 5 is a schematic partial enlarged side view of a circuit board body of a circuit board module of an embodiment according to the disclosure.

DESCRIPTION OF THE EMBODIMENTS

Figure 1:
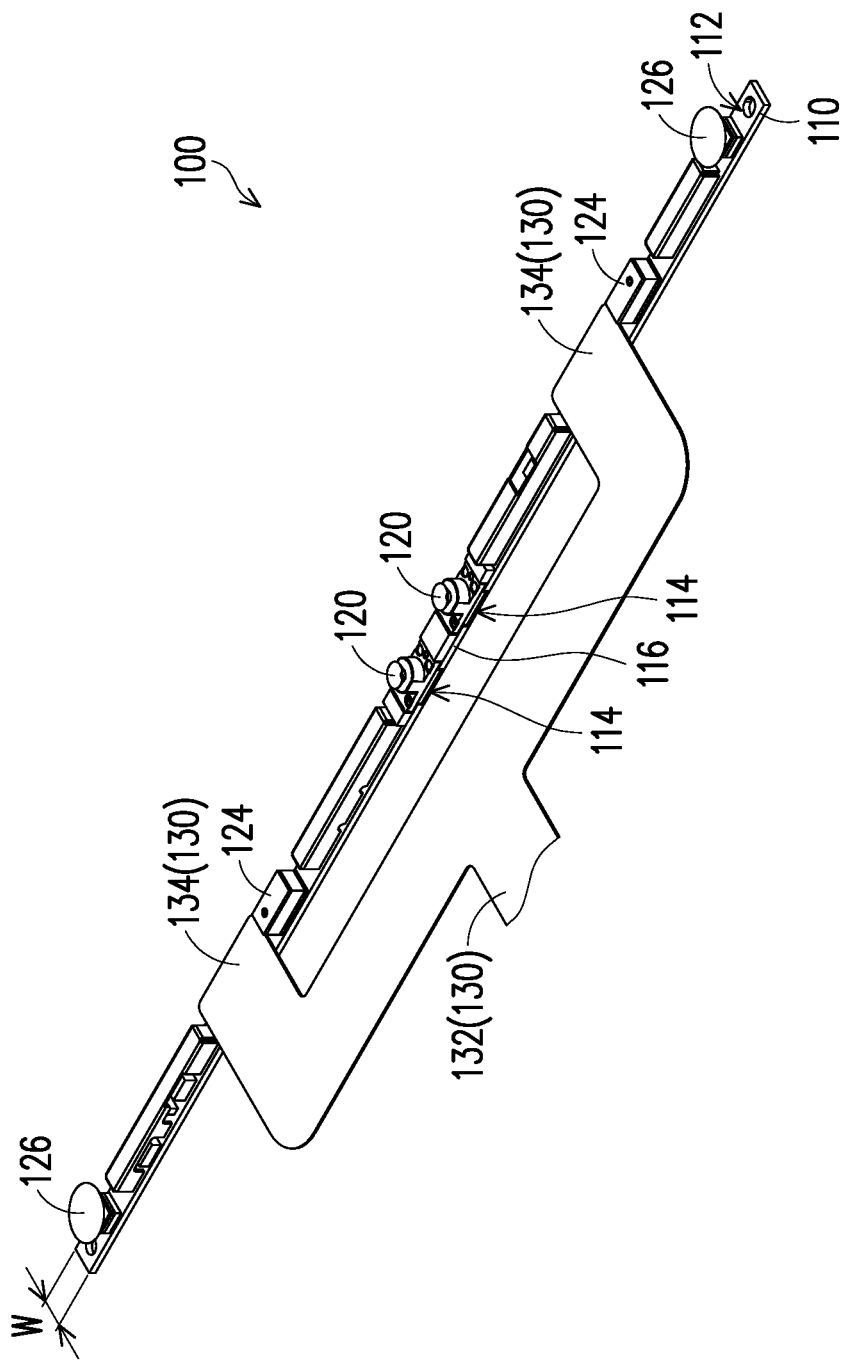
FIG. 1 is a schematic perspective view of a circuit board module according to an embodiment of the disclosure.

Embodiments are provided below for detailed description. However, the embodiments are used as examples for illustration, but not to limit the scope of the disclosure. In addition, the drawings in the embodiment omit some elements to clearly show the technical features of the disclosure. Wherever possible, the same reference numbers are used in the drawings and the description to refer to the same or like parts.

Figure 2:
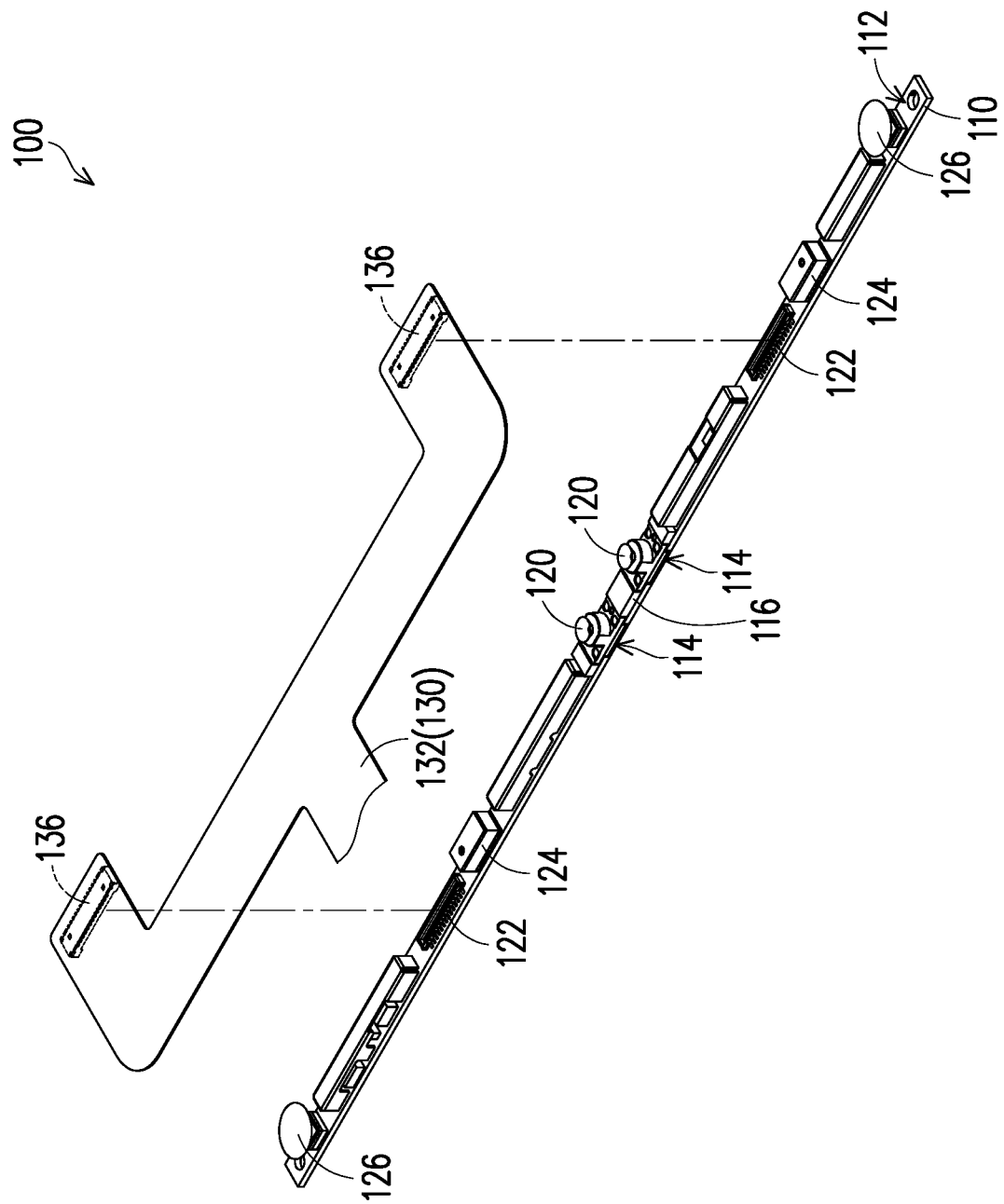
FIG. 2 is a schematic exploded view of the circuit board module in FIG. 1.

FIG. 1 is a schematic perspective view of a circuit board module according to an embodiment of the disclosure. FIG. 2 is a schematic exploded view of the circuit board module in FIG. 1. Referring to FIG. 1 and FIG. 2, the circuit board module 100 of the embodiment is adapted to be disposed in the frame area of a thin electronic device (not shown), especially a thin electronic device with a narrow frame. The type of the electronic device is, for example, a notebook computer, a tablet computer, or a mobile phone, but not limited thereto. For example, the circuit board module 100 may be adapted to be disposed on the upper body of the notebook computer. Certainly, the circuit board module 100 of this embodiment may also be disposed in general electronic devices. The detailed structure of the circuit board module 100 is described below.

As shown in FIG. 2, the circuit board module 100 of this embodiment includes a circuit board body 110, at least one electronic element (for example, two camera elements 120, but the type and number of electronic elements are not limited), at least one board-to-board connector 122 (for example, two board-to-board connectors), and an external circuit board 130. In some embodiments, the camera element 120 may be a complementary metal oxide semiconductor (CMOS) sensor, a charge-coupled device (CCD) sensor, a thin-film transistor (TFT) sensor, an infrared lens, or other sensor that can obtain images, or a combination of these sensors.

Since the circuit board module 100 is adapted to be located in the frame area of thin electronic devices, the width of the circuit board body 110 is narrow. In this embodiment, the width W of the circuit board body 110 is less than 3 millimeters (mm), thereby reducing the width occupied by the circuit board body 110 in the frame area. For example, the width W of the circuit board body 110 is 1.9 mm. The circuit board body 110 includes a surface 112 (for example, the upper surface 112) and at least one groove 114 recessed in the surface 112. The two camera elements 120 are disposed in the at least one groove 114 and electrically connected to the circuit board body 110.

In this embodiment, the at least one groove 114 includes multiple grooves 114 (for example, two grooves), and two camera elements 120 are respectively disposed in the two grooves 114. That is, each camera element 120 is disposed in the corresponding groove 114. In this embodiment, the number of grooves 114 corresponds to the number of camera elements 120, and the size of grooves 114 roughly corresponds to the size of camera elements 120. Such a design facilitates positioning. Certainly, the relationship between the number of grooves 114 and the number of camera elements 120 is not limited thereto.

Compared with directly disposing the camera element 120 on the surface 112, the design of disposing the camera element 120 on the groove 114 reduces the overall height of the circuit board module 100, and is suitable for thin electronic devices.

In addition, at least one (for example, two) board-to-board connectors 122 are disposed on the circuit board body 110, particularly disposed on the surface 112 of the circuit board body 110. The external circuit board 130 includes at least one (for example, two) connection ports 136 (FIG. 2) pluggably connected to the two board-to-board connectors 122, so that the external circuit board 130 is electrically connected to the circuit board body 110.

It should be noted that because the circuit board body 110 of this embodiment is provided with the grooves 114, the space for disposing wiring on the circuit board body 110 is relatively reduced. In this embodiment, the wiring originally to be disposed on the circuit board body 110 (such as power wiring, control signal wiring, high-speed differential signal wiring, etc.) is changed to be disposed on the external circuit board 130. The external circuit board 130 is used to make up for the lost wiring space due to the groove 114 on the circuit board body 110. Even other wiring that were originally to be disposed on the circuit board body 110 may also be disposed on the external circuit board 130, thereby reducing the volume of the circuit board body 110. Therefore, the circuit board module 100 optimizes the wiring disposition through the external circuit board 130.

In this embodiment, the external circuit board 130 includes a flexible circuit board which can be bent and has flexibility to adapt to the internal space of electronic devices. In other embodiments, the external circuit board 130 may also include a flex-rigid board, a rigid circuit board, or a cable. The designer may decide the material of the external circuit board 130 according to their needs.

In this embodiment, the external circuit board 130 is provided with wiring and no electronic part is disposed on the external circuit board 130. Since the external circuit board 130 only has wiring and no electronic part is disposed, the external circuit board 130 has lower requirements and is less limited by materials or styles. In addition, because no electronic part is disposed on the external circuit board 130, the external circuit board 130 is thin and there is no problem of height limitation. Also, there is no problem of damage to the electronic part due to bending.

In addition, the circuit board module 100 further includes at least one first electronic element 124 and at least one second electronic element 126. The at least one first electronic element 124 and the at least one second electronic element 126 are disposed on the surface 112 and electrically connected to the circuit board body 110. Specifically, in this embodiment, two camera elements 120 include two camera elements 120, at least one first electronic element 124 includes two first electronic elements 124, and at least one second electronic element 126 includes two second electronic elements 126. Certainly, the number of the first electronic element 124 and the second electronic element 126 is not limited thereto.

In this embodiment, each of the first electronic elements 124 includes a microphone, and each of the second electronic elements 126 includes a light source. Therefore, the circuit board module 100 provides the user with the effects of capturing images, receiving audio, and making fill light. Certainly, the type of the camera element 120, the first electronic element 124, and the second electronic element 126 is not limited thereto.

In this embodiment, the first electronic element 124, the second electronic element 126, and the board-to-board connector 122 are all disposed on the same surface (surface 112) of the circuit board body 110, and the camera element 120 protrudes from the surface 112.

In addition, the two camera elements 120 are adjacent to each other and are located near the center of the circuit board body 110. The two first electronic elements 124, the two board-to-board connectors 122, and the two second electronic elements 126 are located on two sides (outside) of the two camera elements 120. Specifically, the two board-to-board connectors 122 are symmetrically located on two sides (outside) of the two camera elements 120, while the two first electronic elements 124 are symmetrically located on two sides (outside) of the two board-to-board connectors 122, and the two second electronic elements 126 are symmetrically located on two sides (outside) of the two first electronic elements 124. Certainly, the disposition relationship is not limited thereto.

Certainly, in an embodiment, the two first electronic elements 124, the two board-to-board connectors 122, and the two second electronic elements 126 may also be located asymmetrically on two sides (outside) of the two camera elements 120, respectively, which is not limited by the drawings. The designer may adjust the disposition position according to their needs.

In this embodiment, the external circuit board 130 includes a main section 132 and multiple branches 134 (for example, two branches 134) extending from the main section 132.

The two connection ports 136 (FIG. 2) are respectively disposed on the branches 134 and pluggably connected to the board-to-board connectors 122.

It should be noted that, in this embodiment, since the circuit board body 110 is provided with a groove 114, the circuit board body 110 may have only one layer (but not limited to one layer) of wiring at the groove 114 for electrically connecting to the camera element 120. In this case, the space between the two grooves 114 of the circuit board body 110 is insufficient to dispose other additional wiring. Therefore, in this embodiment, the circuit board body 110 includes a wiring section 116 between the two grooves 114. In the wiring section 116, ground shielding layers may be disposed, but the wiring for conducting the two camera elements is not disposed. In other words, in this embodiment, the wiring of the circuit board body 110 extends from the two grooves 114 to the left and right sides of the circuit board body 110. That is to say, the camera element 120 of the groove 114 on the left side of the wiring section 116 is electrically connected to the board-to-board connector 122 on the left side of the wiring section 116 through the wiring, while the camera element 120 of the groove 114 on the right side of the wiring section 116 is electrically connected to the board-to-board connector 122 on the right side of the wiring section 116 through the wiring. Furthermore, the two camera elements 120 on two sides of the wiring section 116 are electrically connected to each other through the external circuit board 130, but are not electrically connected to each other through the wiring section 116.

In addition, in this embodiment, the two first electronic elements 124, the two board-to-board connectors 122, and the two second electronic elements 126 are located on two sides (outside) of the two camera elements 120, respectively, so that the camera element 120, the first electronic element 124, and the second electronic element 126 on the left half transmit signals through the circuit board body 110 on the left half. Furthermore, the camera element 120, the first electronic element 124, and the second electronic element 126 on the left half transmit signals to the branch 134 on the left side of the external circuit board 130 through the board-to-board connector 122 on the left half.

Similarly, the camera element 120, the first electronic element 124, and the second electronic element 126 on the right half transmit signals through the circuit board body 110 on the right half. Furthermore, the camera element 120, the first electronic element 124, and the second electronic element 126 on the right half electrically connect the branch 134 on the right side of the external circuit board 130 through the board-to-board connector 122 on the right half.

The main section 132 of the external circuit board 130 may be plugged into the main board (not shown), and the signals of the left and right halves of the circuit board body 110 are integrated from the two branches 134 to the main section 132 and then transmitted to the main board.

In addition, the signal from the main board may also be transmitted to the left and right halves of the circuit board body 110 through the main section 132 and the two branches 134 of the external circuit board 130. Besides, the wiring of the two branches 134 of the external circuit board 130 is conductive, so that the signals of the left and right halves of the circuit board body 110 may also be transmitted to each other through the external circuit board 130. Certainly, in an embodiment, the wiring of the two branches 134 of the external circuit board 130 may also be independent of each other without being conducted to each other.

Figure 3:
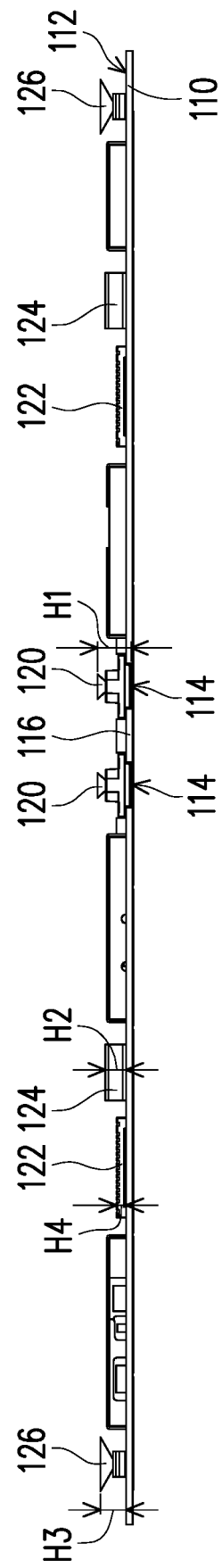
FIG. 3 is a schematic side view of the circuit board module in FIG. 1.

FIG. 3 is a schematic side view of the circuit board module in FIG. 1. Referring to FIG. 3, in this embodiment, the height H2 of the first electronic element 124, the height H3 of the second electronic element 126, and the height H4 of the board-to-board connector 122 are all less than the height H1 of the camera element 120. That is to say, in this embodiment, the camera element 120 with the largest height in the circuit board module 100 is disposed in the groove 114, which reduces the overall height most obviously. The first electronic element 124, the second electronic element 126, and the board-to-board connector 122 with smaller height is directly disposed on the surface 112 of the circuit board body 110. Such a design avoids affecting the wiring disposition and the structural strength of the circuit board body 110 due to having too many grooves 114 on the circuit board body 110.

FIG. 4 is a schematic partial enlarged view of the circuit board body of FIG. 3. Referring to FIG. 4, the thickness T2 of the circuit board body 110 at each groove 114 must be at least half of the thickness T1 of the circuit board body 110 at a position other than the at least one groove 114. The smaller the thickness T2 of the circuit board body 110 at each groove 114 is, the smaller the height of the camera element 120 protruding from the surface 112.

Specifically, the thickness T2 of the circuit board body 110 at each groove 114 is less than 0.2 mm, and the thickness T1 of the circuit board body 110 at positions other than the at least one groove 114 is less than 0.5 mm. For example, the thickness T2 of the circuit board body 110 at each groove 114 is 0.1 mm, and the thickness T1 of the circuit board body 110 at positions other than the at least one groove 114 is 0.35 mm. In an embodiment, for example, the circuit board body 110 is a six-layer board. Only one layer of board could be left at the groove 114, and the thickness T2 at the groove 114 may also be 0.08 mm.

In addition, the camera element 120 may also use a photosensitive element of a chip on board (COB) process with a lens with a small height, so that the height of the camera element 120 is small. The thickness T1 of the circuit board body 110 is relatively small, and the thickness T2 at the groove 114 is even smaller. Therefore, with the camera element 120 having a small height, the height of the circuit board module 100 is minimized.

The circuit board module 100 of this embodiment is provided with a groove 114 on the circuit board body 110 to accommodate the camera element 120, thereby reducing the overall height of the circuit board module 100. By disposing part of the wiring on the external circuit board 130, the width W of the circuit board body 110 is reduced, which is suitable to be applied to a device with a narrow frame. In addition, the circuit board module 100 of the embodiment shares part of the wiring through the external circuit board 130. Thus, the camera element 120, the first electronic element 124, the second electronic element 126, and the board-to-board connector 122 are able to be disposed on the relatively narrow circuit board body to provide multiple functions.

In addition, in this embodiment, the portion of the circuit board body 110 other than the groove 114 may be a six-layer board. The inner layer of the circuit board body 110 may be selectively disposed of electrostatic protection elements (not shown), thereby improving the electromagnetic protection effect of the camera element 120, the first electronic element 124, the second electronic element 126, and the board-to-board connector 122.

Furthermore, the wiring section 116 of the circuit board body 110 may be provided with optical alignment points or totems, such as copper dots (not shown), to facilitate the alignment of the camera element 120 during assembly. In addition, the thickness of the wiring section 116 of the circuit board body 110 is the same as the thickness of the circuit board body 110 at positions other than the groove 114 (both are thickness T1), which provides structural strength.

FIG. 5 is a schematic partial enlarged side view of a circuit board body of a circuit board module of an embodiment according to the disclosure. Referring to FIG. 5, the main difference between the embodiment illustrated in FIG. 5 and the previous embodiments is that, in this embodiment, at least one groove 114a is one groove 114a. That is, the circuit board body 110a has only a single groove 114a, and the two camera elements 120 are disposed in the same groove 114a. Certainly, the relationship between the number of camera element 120 and the number of groove 114 and groove 114a is not limited thereto.

Figure 6:
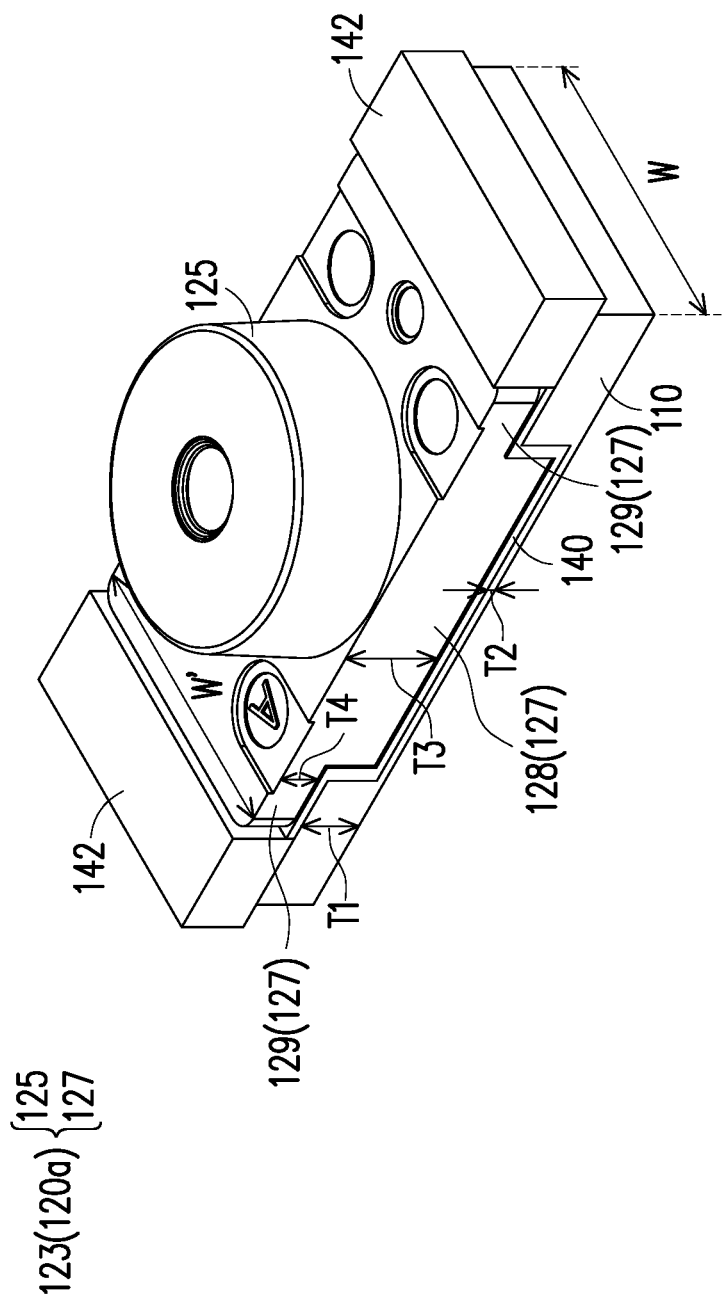
FIG. 6 is a schematic partial enlarged view of a circuit board module according to an embodiment of the disclosure.
Figure 7:
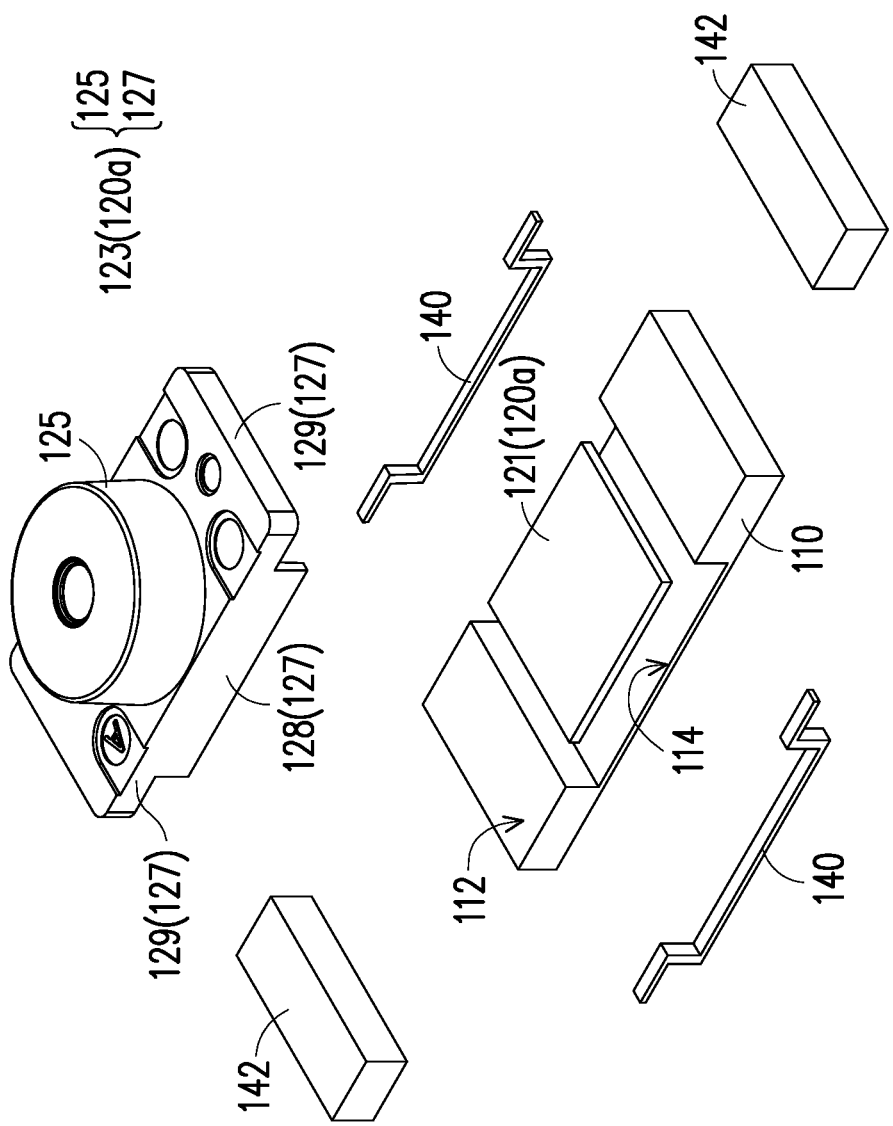
FIG. 7 is a schematic exploded view of FIG. 6.

FIG. 6 is a schematic partial enlarged view of a circuit board module according to an embodiment of the disclosure. FIG. 7 is a schematic exploded view of FIG. 6. Referring to FIG. 6 and FIG. 7, the width W of the circuit board body 110 is greater than or equal to the width W' of the camera element 120a. In this embodiment, the width W of the circuit board body 110 is the same as the width W' of the camera element 120, so that the circuit board body 110 has a relatively narrow width W.

In this embodiment, the camera element 120a includes a photosensitive element 121 and a lens assembly 123. Photosensitive element 121 is located in groove 114. The lens assembly 123 is disposed on the photosensitive element 121. A part of the lens assembly 123 is located in the groove 114. Two sides of the lens assembly 123 are supported on the surface 112 of the circuit board body 110 beside the groove 114. In this embodiment, the lens assembly 123 is a structure in which the lens 125 and the carrying base 127 are integrally formed, but the form of the lens assembly 123 is not limited thereto.

The carrying base 127 includes a main section 128 and two extension sections 129. The lens 125 is connected to the main section 128, and the main section 128 is correspondingly disposed on the groove 114. The two extension sections 129 are respectively located on two sides of the main section 128 and disposed on the surface 112 of the circuit board body 110 beside the groove 114. As shown in FIG. 6, in this embodiment, the thickness T3 of the main section 128 plus the thickness T2 of the circuit board body 110 at the groove 114 is substantially the same as the thickness T4 of the extension section 129 plus the thickness T1 of circuit board body 110 at positions other than the groove.

The camera element 120a is, for example, fixed to the groove 114 of the circuit board body 110 through the fixing member 140 and fixing member 142. The fixing member 140 and fixing member 142 are, for example, glue, but the types of the fixing member 140 and fixing member 142 are not limited thereto.

As shown in FIG. 7, the contours of the two fixing members 140 correspond to the contours of the surface 112 and the groove 114 of the circuit board body 110 and are disposed between the lens assembly 123 and the surface 112 and the groove 114 of the circuit board body 110 along contours of the surface 112 and the groove 114 of the circuit board body 110. In addition, two fixing members 142 are disposed on the surface 112 of the circuit board body 110 and contact two sides of the lens assembly 123 (i.e., the extension section 129). Certainly, the positions of the fixing member 140 and the fixing member 142 are not limited thereto.

To sum up, the circuit board body of the circuit board module of the disclosure includes a groove recessed in the surface. The camera element is disposed in the groove and electrically connected to the circuit board body to reduce the overall height of the circuit board module. In addition, because the circuit board body is provided with grooves, the space for disposing wiring on the circuit board body is relatively reduced. In order to obtain more wiring space, the connection port of the external circuit board is pluggably connected to the board-to-board of the circuit board body, so that the external circuit board is electrically connected to the circuit board body. Therefore, the wiring originally to be disposed on the circuit board body is changed to the external circuit board. The external circuit board is used to make up for the space for disposing wiring on the circuit board body, thereby optimizing the wiring disposition.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A circuit board module, comprising:
    a circuit board body comprising a surface and at least one groove recessed in the surface;
    two camera elements disposed in the at least one groove and electrically connected to the circuit board body;
    two board-to-board connectors disposed on the circuit board body; and
    an external circuit board comprising two connection ports, wherein the two connection ports are pluggably connected to the two board-to-board connectors, so that the external circuit board is electrically connected to the circuit board body.

2. The circuit board module according to claim 1, wherein the at least one groove comprises two grooves, and the two camera elements are respectively disposed in the two grooves.

3. The circuit board module according to claim 2, wherein the circuit board body comprises a wiring section between the two grooves, and the two camera elements are electrically connected to each other through the external circuit board, but not electrically connected to each other through the wiring section.

4. The circuit board module according to claim 1, wherein the external circuit board comprises a main section and two branches extending from the main section, and the two connection ports are respectively disposed on the two branches and pluggably connected to the two board-to-board connectors.

5. The circuit board module according to claim 1, further comprising:
at least one first electronic element disposed on the surface and electrically connected to the circuit board body, wherein each of the board-to-board connectors is disposed on the surface, and a height of each of the board-to-board connectors and each of the at least one first electronic element is less than a height of each of the camera elements.

6. The circuit board module according to claim 5, further comprising:
at least one second electronic element disposed on the surface and electrically connected to the circuit board body, wherein a height of each of the at least one second electronic element is less than the height of each of the camera elements.

7. The circuit board module according to claim 6, wherein each of the at least one first electronic element comprises a microphone, and each of the at least one second electronic element comprises a light source.

8. The circuit board module according to claim 6, wherein the at least one first electronic element comprises two first electronic elements, the at least one second electronic element comprises two second electronic elements, the two camera elements are adjacent to each other, the two first electronic elements are located on two sides of the two camera elements, the two second electronic elements are located on two sides of the two camera elements, and the two board-to-board connectors are located on two sides of the two camera elements.

9. The circuit board module according to claim 1, wherein the at least one groove is one groove, and the two camera elements are disposed in the groove.

10. The circuit board module according to claim 1, wherein the external circuit board is provided with wiring and no electronic part is disposed on the external circuit board.

11. The circuit board module according to claim 1, wherein a thickness of the circuit board body at each of the at least one groove is less than half of a thickness of the circuit board body at positions other than the at least one groove.

12. The circuit board module according to claim 1, wherein a thickness of the circuit board body at each of the at least one groove is less than 0.2 mm, and a thickness of the circuit board body at positions other than the at least one groove is less than 0.5 mm.

13. The circuit board module according to claim 1, wherein a width of the circuit board body is less than 3 mm.

14. The circuit board module according to claim 1, wherein a width of the circuit board body is the same as a width of each of the camera elements.

* * * * *